US010277788B2

(12) United States Patent
Jeong et al.

(10) Patent No.: US 10,277,788 B2
(45) Date of Patent: Apr. 30, 2019

(54) ULTRATHIN DIGITAL CAMERA AND METHOD OF MANUFACTURING THE SAME

(71) Applicant: KOREA ADVANCED INSTITUTE OF SCIENCE AND TECHNOLOGY, Daejeon (KR)

(72) Inventors: Ki-Hun Jeong, Daejeon (KR); Dongmin Keum, Daejeon (KR); Kyungwon Jang, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 15/400,875

(22) Filed: Jan. 6, 2017

(65) Prior Publication Data

US 2017/0195534 A1 Jul. 6, 2017

(30) Foreign Application Priority Data

Jan. 6, 2016 (KR) ........................ 10-2016-0001333

(51) Int. Cl.
*H04N 5/225* (2006.01)
*H01L 27/146* (2006.01)
(Continued)

(52) U.S. Cl.
CPC ............ *H04N 5/2254* (2013.01); *G02B 1/11* (2013.01); *G02B 3/0056* (2013.01); *G02B 5/045* (2013.01);
(Continued)

(58) Field of Classification Search
CPC ...... H04N 5/225; H04N 5/2253; H04N 5/374; H01L 27/14627; G02B 5/045;
(Continued)

(56) References Cited

U.S. PATENT DOCUMENTS

| 7,683,310 | B1 * | 3/2010 | Sinclair ................ G01S 7/4804 250/203.1 |
| 2007/0053037 | A1 * | 3/2007 | Kang ................ H01L 27/14621 359/204.1 |

(Continued)

FOREIGN PATENT DOCUMENTS

| KR | 1020090051587 A | 5/2009 |
| KR | 101485889 B1 | 1/2015 |

OTHER PUBLICATIONS

Keum, D. et al., "Artificial Compound Eye Inspired by Imaging Principle of Xenos Peckii," Paper, Proceedings of the 18th International Conference on Solid-State Sensors, Actuators and Microsystems (Transducers 2015), Jun. 21, 2015, Anchorage, Alaska, (Year: 2015).*

(Continued)

*Primary Examiner* — Abdelaaziz Tissire
(74) *Attorney, Agent, or Firm* — McCoy Russell LLP (57) ABSTRACT

Provided are an ultrathin digital camera inspired by an eye of an insect, that includes a prism array including a plurality of transmission channels refracting incident light and a micro lens array including micro lenses focusing the light and is implemented so that the respective transmission channels receive visual information on partial regions of an entire field of view (FOV) like a visual organ of the eye of the insect, and a method of manufacturing the same.

19 Claims, 9 Drawing Sheets

(51) Int. Cl.
*G02B 1/11* (2015.01)
*H04N 5/374* (2011.01)
*G02B 13/00* (2006.01)
*G02B 3/00* (2006.01)
*G02B 5/04* (2006.01)
*G02B 19/00* (2006.01)

(52) U.S. Cl.
CPC ....... *G02B 13/006* (2013.01); *G02B 19/0014* (2013.01); *G02B 19/0076* (2013.01); *H01L 27/1462* (2013.01); *H01L 27/14627* (2013.01); *H01L 27/14685* (2013.01); *H04N 5/2253* (2013.01); *H04N 5/374* (2013.01); *G02B 3/0068* (2013.01)

(58) Field of Classification Search
CPC .............. G02B 3/0056; G02B 19/0014; G02B 19/0076; G02B 3/0068
See application file for complete search history.

(56) References Cited

U.S. PATENT DOCUMENTS

| | | | | |
|---|---|---|---|---|
| 2007/0090275 | A1* | 4/2007 | Toyoda | H01L 27/14621 250/208.1 |
| 2007/0200946 | A1* | 8/2007 | Onozawa | G02B 5/32 348/340 |
| 2009/0179142 | A1* | 7/2009 | Duparre | G02B 3/0031 250/208.1 |
| 2010/0085466 | A1* | 4/2010 | Fujimori | A61B 1/00096 348/340 |
| 2012/0147228 | A1* | 6/2012 | Duparre | H04N 9/045 348/262 |
| 2013/0033767 | A1* | 2/2013 | Rudmann | B29D 11/00307 359/722 |
| 2013/0155522 | A1* | 6/2013 | Jeong | G02B 3/02 359/664 |
| 2016/0252734 | A1* | 9/2016 | Rossi | G02B 17/08 348/340 |

OTHER PUBLICATIONS

Druart, G. et al., "Demonstration of an infrared microcamera inspired by Xenos peckii vision," Applied Optics, vol. 48, No. 18, Jun. 20, 2009, 7 pages.

Song, Y. et al., "Digital Cameras with Designs Inspired by the Arthropod Eye," Nature, vol. 497, May 2, 2013, 41 pages.

Keum, D., et al., "Design and microfabrication of an artificial compound eye inspired by Xenos peckii visual system," Paper, Proceedings of the 17th Korean MEMS Conference 2015 (KMEMS 2015), Apr. 2, 2015, Jeju, Korea, 2 pages. (See English Abstract p. 1).

Keum, D., et al., "Design and microfabrication of an artificial compound eye inspired by Xenos peckii visual system," Poster, Proceedings of the 17th Korean MEMS Conference 2015 (KMEMS 2015), Apr. 2, 2015, Jeju, Korea, 1 page.

Keum, D. et al., "Artificial Compound Eye Inspired by Imaging Principle of Xenos Peckii," Paper, Proceedings of the 18th International Conference on Solid-State Sensors, Actuators and Microsystems (Transducers 2015), Jun. 21, 2015, Anchorage, Alaska, 4 pages.

Keum, D. et al., "Artificial Compound Eye Inspired by Imaging Principle of Xenos Peckii," Powerpoint Presentation, Proceedings of the 18th International Conference on Solid-State Sensors, Actuators and Microsystems (Transducers 2015), Jun. 23, 2015, Anchorage, Alaska, 15 pages.

* cited by examiner

ULTRATHIN DIGITAL CAMERA AND METHOD OF MANUFACTURING THE SAME

CROSS-REFERENCE TO RELATED APPLICATIONS

This application claims priority under 35 U.S.C. § 119 to Korean Patent Application No. 10-2006-0001333, filed on Jan. 6, 2016, in the Korean Intellectual Property Office. The entire disclosure of which is incorporated herein by reference in its entirety for all purposes.

TECHNICAL FIELD

The following disclosure relates to an ultrathin digital camera inspired by an eye of an insect and a method of manufacturing the same. More particularly, the following disclosure relates to an ultrathin digital camera inspired by an eye of an insect, that includes a prism array including a plurality of transmission channels refracting incident light and a micro lens array including micro lenses focusing the light and is implemented so that the respective transmission channels receive visual information on partial regions of an entire field of view (FOV) like a visual organ of the eye of the insect, and a method of manufacturing the same.

BACKGROUND

An insect among living things present in the natural world has compound eyes. The compound eye consists of a number of ommatidia arranged in a spherical shape. In other words, the ommatidium is a unit configuring the compound eye. Here, the respective channels (ommatidia) are directed toward slightly different directions, and receive only signals incident within a predetermined range in relation to optical axes of the channels to form a final image.

This structure has a wide field of view, may sense rapid movement, and is advantageous in miniaturization. Therefore, recently, many miniaturized optical sensors inspired by a visual structure of the insect have been developed.

Particularly, recently, a demand for compact and ultrathin cameras has increased. However, there is a limitation in miniaturizing conventional lens designs. Therefore, an imaging system inspired by the eye of the insect has been prominent as an alternative to the existing imaging systems.

As a technology related to the imaging system inspired by the eye of the insect, there is a scientific treatise entitled "Digital cameras with designs inspired by the arthropod eye" (author: Young Min Song, Yizhu Xie, Viktor Malyarchuk, Jianliang Xiao, Inhwa Jung, Ki-Joong Choi, Zhuangjian Liu, Hyunsung Park, Chaofeng Lu, Rak-Hwan Kim, Rui Li, Kenneth B. Crozier, Yonggang Huang and John A. Rogers, journal: Nature, Vol. 497 on May, 2013).

Figure 1:
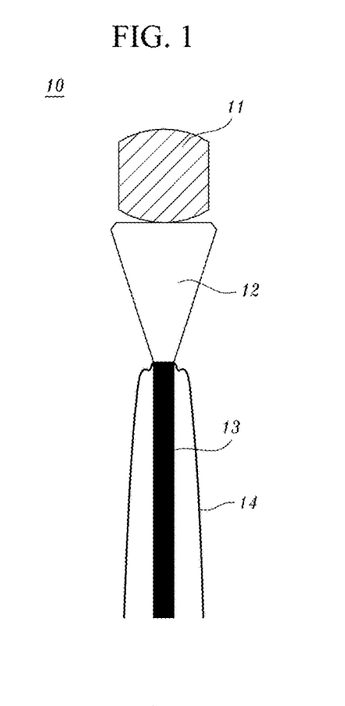
FIG. 1 is a view illustrating an ommatidium of an eye of a natural insect.

Meanwhile, FIG. 1 is a view illustrating an ommatidium of an eye of a natural insect.

Each ommatidium includes a facet lens 11 receiving light, a rhabdom 13 guiding the light incident through the facet lens 11, a crystalline cone 12 connecting the facet lens 11 and the rhabdom 13 to each other, and a photoreceptor cell 14 sensing the light. Here, one ommatidium senses only light incident within a predetermined range from a direction toward which it is directed.

The optical sensor inspired by the structure of the eye of the insect as described above has the same advantage as an advantage of the eye of the insect, such that it may more accurately sense a range wider than those of existing distance and position sensors. Therefore, an invention for the optical sensor inspired by the structure of the eye of the insect has been demanded.

RELATED ART DOCUMENT

Non-Patent Document

"Digital cameras with designs inspired by the arthropod eye" (author: Young Min Song, Yizhu Xie, Viktor Malyarchuk, Jianliang Xiao, Inhwa Jung, Ki-Joong Choi, Zhuangjian Liu, Hyunsung Park, Chaofeng Lu, Rak-Hwan Kim, Rui Li, Kenneth B. Crozier, Yonggang Huang and John A. Rogers, journal: Nature, Vol. 497 on May, 2013).

SUMMARY

An embodiment of the present invention is directed to providing an ultrathin digital camera inspired by an eye of an insect, that includes a prism array including a plurality of transmission channels refracting incident light and a micro lens array including micro lenses focusing the light and is implemented so that the respective transmission channels receive visual information on partial regions of an entire field of view (FOV) like a visual organ of the eye of the insect, and a method of manufacturing the same.

In one general aspect, an ultrathin digital camera inspired by an eye of an insect includes: a prism array 100 having a prism structure formed on a first substrate 110 to refract light incident thereto; a micro lens array 200 coupled to a lower side the prism array 100 in a state in which it is spaced apart from the prism array 100 by a predetermined distance and collecting light passing through the prism array 100 and vertically incident thereto; and an image sensor 300 receiving light passing through the micro lens array 200 and processing the received light.

The prism array 100 may include: transmission channels 120 formed on the first substrate 110 and formed of a colorless photoresist; and blocking regions 130 formed of a black photoresist to absorb the light and formed alternately with the transmission channels.

An angle between the transmission channels 120 meaning a difference of an angle at which the light is refracted in the respective transmission channels 120 may be smaller than a field of view (FOV) of one transmission channel 120.

Micro lenses 220 of the micro lens array 200 may be positioned below the transmission channels 120 of the prism array 100.

The micro lens 220 may have a diameter larger than or equal to that of the transmission channel 120.

The micro lens array 200 may include a spacer 230 formed at an edge thereof, the spacer 230 having a height higher than that of the micro lens 220.

The first substrate 110 may be a glass substrate through which the light passes.

The micro lens array 200 may be formed on a second substrate 210, and apertures may be formed at a lower side of the first substrate.

The aperture may be formed of a metal or a black polymer.

The prism array 100 may have an antireflective nano structure formed on an upper surface thereof, the antireflective nano structure being a nano structure having a size and a period of an optical wavelength or less.

In another general aspect, a method of manufacturing the ultrathin digital camera inspired by an eye of an insect includes: a mask patterning step (S100) of patterning metal masks on one surface or both surfaces of the first substrate 110; a step (S200) of patterning pillar structures at predetermined intervals on one surface of the first substrate 110; a coating step (S300) of coating colorless photoresists on one surface of the first substrate 110; a soft baking step of removing solvent of photoresist (S400); a pressing step (S500) of contacting and pressing a prism forming part 140 having a hemispherical or spherical shape on an upper surface of the first substrate 110; a polydimethylsiloxane (PDMS) coating step (S600) of coating PDMS after detaching the prism forming part 140; an ultraviolet (UV) ray irradiating step (S700) of irradiating an ultraviolet ray on the other side surface of the first substrate 110; a post exposure baking (PEB) step of baking exposed photoresist (S800); a PDMS removing step (S900) of removing the PDMS after post exposure baking (PEB); a developing step (S1000) of forming the transmission channels 120 of the prism array 100 through a developing process; a step (S1100) of filling black photoresists in spaces between the transmission channels 120 having an array form; and a step (S1200) of coupling the completed prism array 100 to an upper side of the micro lens array 200.

The pressing step (S500) may be performed in a soft baking process.

The micro lens array 200 may be manufactured through: a spacer forming step (A100) of patterning a polymer spacer 230 on a substrate 240; a photoresist patterning step (A200) of patterning photoresist at predetermined intervals on the substrate 240; a reflow step (A300) of allowing the patterned photoresist to reflow by applying heat; a pattern duplicating step (A400) of duplicating patterns to PDMS by coating the PDMS on the substrate 240; and a micro lens array forming step (A500) of transferring the patterns to a second substrate 210 on which a UV-curable resin is coated, using the PDMS to which the patterns are duplicated.

The micro lens array 200 may be manufactured, in a wafer level process, through: a spacer forming step (A100) of patterning a polymer spacer 230 on a substrate 240; a photoresist patterning step (A200) of patterning photoresist at predetermined intervals on the substrate 240; and a reflow step (A300) of allowing the patterned photoresist to reflow by applying heat.

The prism forming part 140 may be any one of a ball lens, a mold having a curved structure, and a mold in which sawteeth having a width or a height that gradually becomes larger from a center toward an edge are formed on the upper surface of the substrate.

In the case in which the mold including the sawteeth having the width or the height that gradually becomes larger from the center toward the edge is the prism forming part 140, the step (S200) of patterning the pillar structures at the predetermined intervals on one surface of the first substrate 110 may be omitted.

The first substrate 210 may be a glass substrate through which the light passes.

| DETAILED DESCRIPTION OF MAIN ELEMENTS | |
|---|---|
| 1: ultrathin digital camera inspired by eye of insect | |
| 100: prism array | |
| 110: first substrate | 120: transmission channel |
| 130: blocking region | 140: prism forming part |
| 150: metal mask | |
| 161: colorless photoresist | |
| 162: black photoresist | |
| 200: micro lens array | |
| 210: second substrate | 220: micro lens |
| 230: spacer | 240: substrate |
| 300: image sensor | |
| S100~S1200: respective steps of method of manufacturing ultrathin digital camera inspired by eye of insect | |
| A100~A500: respective steps of method of manufacturing micro lens array | |

DETAILED DESCRIPTION OF EMBODIMENTS

Hereinafter, an ultrathin digital camera inspired by an eye of an insect and a method of manufacturing the same according to an exemplary embodiment of the present invention will be described in detail with reference to the accompanying drawings.

Figure 2:
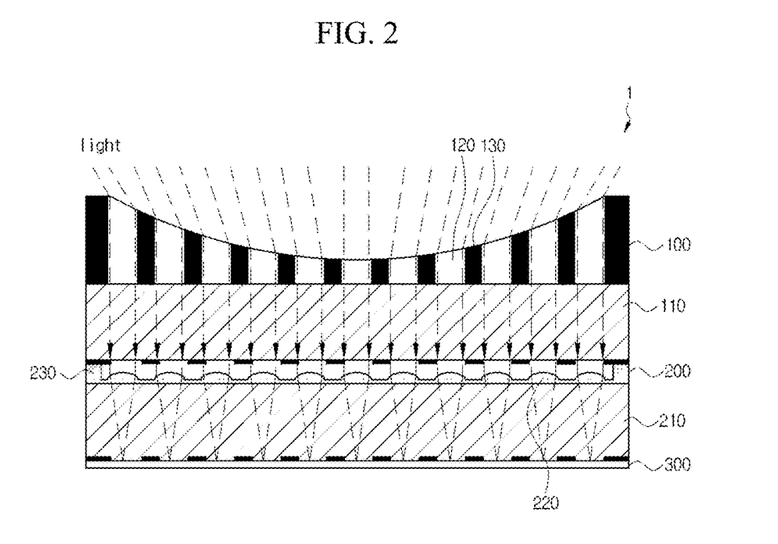
FIG. 2 is a cross-sectional view illustrating an ultrathin digital camera inspired by an eye of an insect according to an exemplary embodiment of the present invention.

As illustrated in FIG. 2, the ultrathin digital camera 1 inspired by an eye of an insect according to an exemplary embodiment of the present invention is configured to include a prism array 100 including a plurality of transmission channels 120 refracting light incident thereto, a micro lens array 200 including micro lenses 220 focusing the light, and an image sensor 300, and is implemented so that the respective transmission channels 120 receive visual information on partial regions of an entire field of view (FOV) like a visual organ of the eye of the insect.

The respective components will be described in more detail. The prism array 100 has a prism structure formed on a first substrate 110 and having an inclined upper surface to refract light incident thereto.

The prism array 100 is configured to include the first substrate 110 through which light may be transmitted, the transmission channels 120 formed on the first substrate 110 and formed of a colorless photoresist, and blocking regions 130 formed of a black photoresist to absorb the light and formed alternately with the transmission channels. The first substrate 110 may be a glass substrate through which the light may pass.

Here, the upper surface of the prism array 100 on which the transmission channels 120 and the blocking regions 130 are formed has a height that becomes higher from the center thereof toward an edge thereof to refract the light incident thereto from the outside, thereby allowing the light to vertically pass through the transmission channels 120.

As a material of the colorless photoresist and the black photoresist, SU-8 may be used. However, another material may also be used instead of the SU-8 as a material of the colorless photoresist and the black photoresist.

Figure 3:
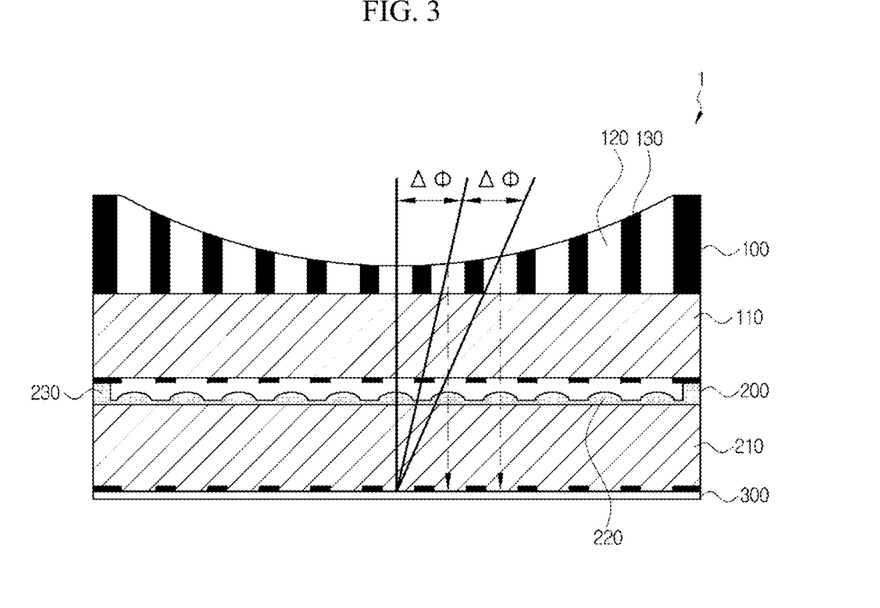
FIG. 3 is a view illustrating an angle between transmission channels in the ultrathin digital camera inspired by an eye of an insect according to an exemplary embodiment of the present invention.

As illustrated in FIG. 3, an angle between the respective transmission channels 120 is defined as a difference between angles at which light is refracted in the transmission channels 120. In the case in which the angle between the transmission channels 120 is larger than a field of view (FOV) of one transmission channel 120, a region that is not sensed by an image sensor according to an exemplary embodiment of the present invention is present.

Therefore, it is preferable that the angle between the transmission channels 120 is smaller than the FOV of one transmission channel 120.

The ultrathin digital camera 1 inspired by an eye of an insect according to an exemplary embodiment of the present invention that is actually manufactured may simultaneously measure one object in several channels while sensing all regions since the FOV of the transmission channel 120 is sufficiently larger than the angle between the transmission channels 120.

This feature may be used to obtain a high resolution image in an image processing step.

Figure 10:
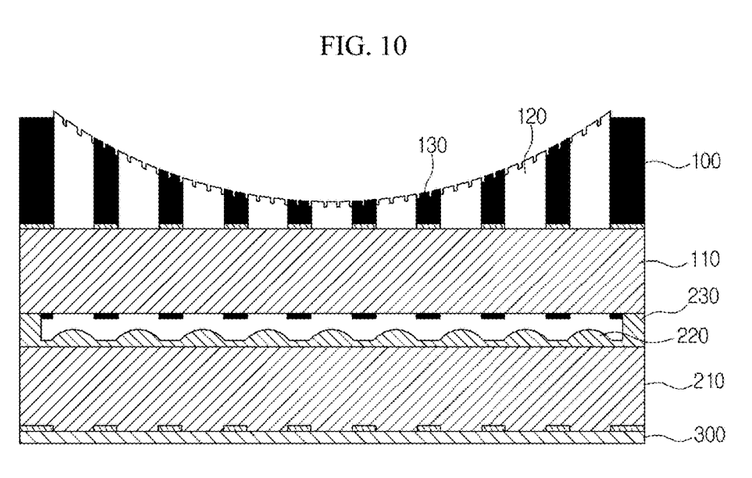
FIG. 10 is a view illustrating another example of the prism array in the ultrathin digital camera inspired by an eye of an insect according to an exemplary embodiment of the present invention.

As another example, as illustrated in FIG. 10, an anti-reflective nano structure may be formed on a surface of the prism array.

In the case in which the anti-reflective nano structure having a size of an optical wavelength or less, reflectivity of the light is decreased and transmissivity of the light is increased.

An incident angle of the light is increased in an edge region of the prism array, such that an amount of light reflected on the surface of the prism array is increased. However, in the case in which the anti-reflective nano structure is formed on the surface of the prism array, the reflectivity of the light may be decreased.

The anti-reflective nano structure has been disclosed in detail in Korean Patent No. 10-1485889 (registered on Jan. 19, 2015) applied by the present applicant, and in the case of applying the anti-reflective nano structure as disclosed in Korean Patent No. 10-1485889 to the present invention, the additional advantage as described above may be obtained. Anti-reflective layer can be used for coating instead of anti-reflective nanostructure.

Meanwhile, the micro lens array 200 is coupled to a lower side of the prism array 100 in a state in which it is spaced apart from the prism array 100 by a predetermined distance, and serves to collect light passing through the prism array 100 and vertically incident thereto.

As illustrated in FIG. 2, in the ultrathin digital camera 1 inspired by an eye of an insect according to an exemplary embodiment of the present invention, the micro lenses 220 of the micro lens array 200 are positioned below the transmission channels 120 of the prism array 100, and the transmission channels 120 and the micro lenses 220 have the same diameter, such that the light passing through the transmission channels 120 and vertically incident thereto may be collected at one point through the micro lenses 220 without being lost or distorted.

Here, the micro lens 220 may also have a diameter larger than that of the transmission channel 120 depending on a design.

As described above, the micro lens array 200 is disposed below the prism array 100 in the state in which it is spaced apart from the prism array 100 by the predetermined distance. To this end, a spacer 230 having a height higher than that of the micro lens 220 may be formed at an edge of the micro lens array 200.

Next, the image sensor 300 receives light passing through the micro lens array 200, and processes the received light. A commercialized complementary metal oxide semiconductor (CMOS) image sensor (CIS) may be used as the image sensor 300. The image sensor 300 may contact and be coupled to a lower surface of the micro lens array 200.

In summary, the ultrathin digital camera 1 inspired by an eye of an insect according to an exemplary embodiment of the present invention includes the prism array 100 refracting the light, the micro lens array 200 collecting the light to form an image, aperture array to block the light from neighboring channels, and image sensor. The respective transmission channels 120 form partial images of slightly different regions like a visual organ of the insect, and an entire image is formed by using these images.

Meanwhile, as illustrated in FIGS. 4A to 4G, manufacturing steps of a micro prism array in a method of manufacturing an ultrathin digital camera inspired by an eye of an insect according to an exemplary embodiment of the present invention includes a mask patterning step (S100), a step (S200) of patterning pillar structures, a spin coating step (S300), a soft baking step (S400), a pressing step (S500), a polydimethylsiloxane (PDMS) coating step (S600), an ultraviolet ray irradiating step (S700), a post exposure baking (PEB) step (S800), a PDMS removing step (S900), a developing step (S1000), a step (S1100) of filling black photoresists.

Figure 4A:
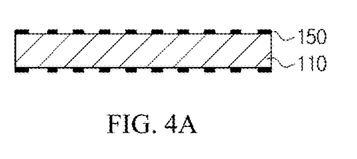
FIGS. 4A, 4B, 4C, 4D, 4E, 4F and 4G are views sequentially illustrating manufacturing steps of a micro prism array in a method of manufacturing an ultrathin digital camera inspired by an eye of an insect according to an exemplary embodiment of the present invention.

First, in the mask patterning step (S100), metal masks on which predetermined patterns are formed on one surface or both surfaces of the glass substrate 110 configuring the prism array 100.

Figure 4B:
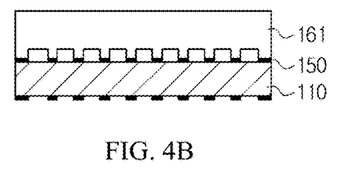

Next, pillar structures are patterned at predetermined intervals (S200), as illustrated in FIG. 4B. When an amount of irradiated ultraviolet ray is adjusted to be appropriate for a structure having a thick thickness in the ultraviolet ray irradiating step, ultraviolet ray is overexposed in a structure having a low thickness at the center, such that the ultraviolet ray is irradiated up to photoresists between channels, thereby generating a polymerization phenomenon in these regions. The pillar structures are required to prevent this phenomenon.

Here, the metal mask may be formed on a surface of the glass substrate 110 on which a prism is patterned, and apertures may be formed on the other surface of the glass substrate using a metal or a black polymer. Here, a black photoresist corresponds to the black polymer. In addition, another material may also be used instead of the black polymer as a material of the aperture.

Figure 4C:
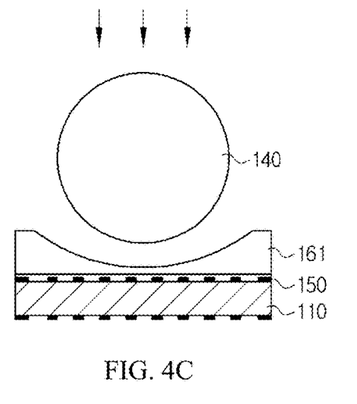

Next, in the spin coating step (S300), the colorless photoresists are spin-coated on one surface of the first substrate 110.

Next, in the soft baking step (S400), solvent of coated photoresist is removed.

Figure 4D:
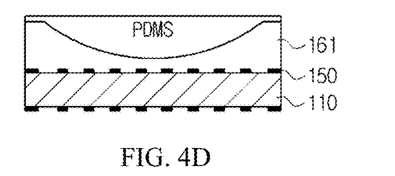

Next, in the pressing step (S500), a prism forming part 140 having a hemispherical or spherical shape contacts and is pressed on the upper surface of the first substrate 110 in a soft baking process, thereby forming a shape of a top surface of the prism array 100 having a height that gradually becomes higher from the center of the prism array 100 toward an edge thereof.

Figure 5:
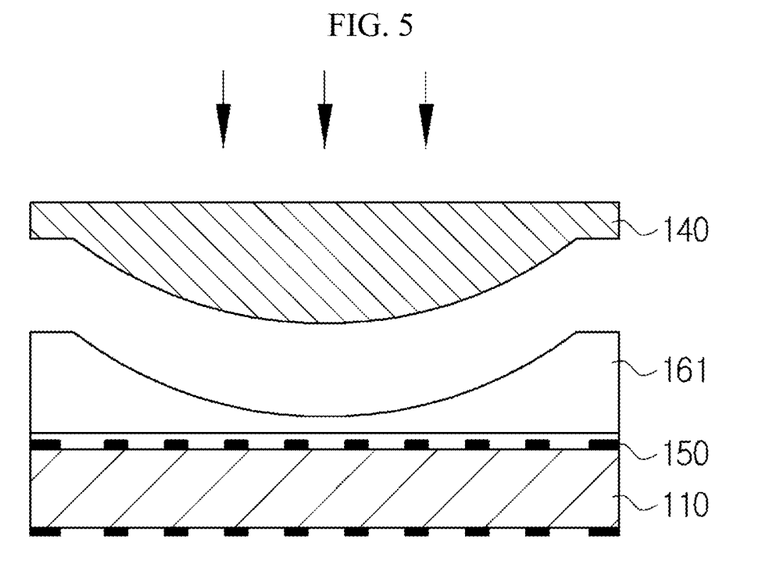
FIGS. 5, 6A and 6B are views illustrating another example of a pressing step of a prism forming part in the method of manufacturing an ultrathin digital camera inspired by an eye of an insect according to an exemplary embodiment of the present invention.

Here, the prism forming part 140 may be a ball lens, or may be a mold having a curved structure on the substrate, as illustrated in FIG. 5. When the mold having the curved structure is manufactured on the substrate having a wafer size, a wafer level process is also possible, such that a manufacturing cost may be decreased.

Figure 7:
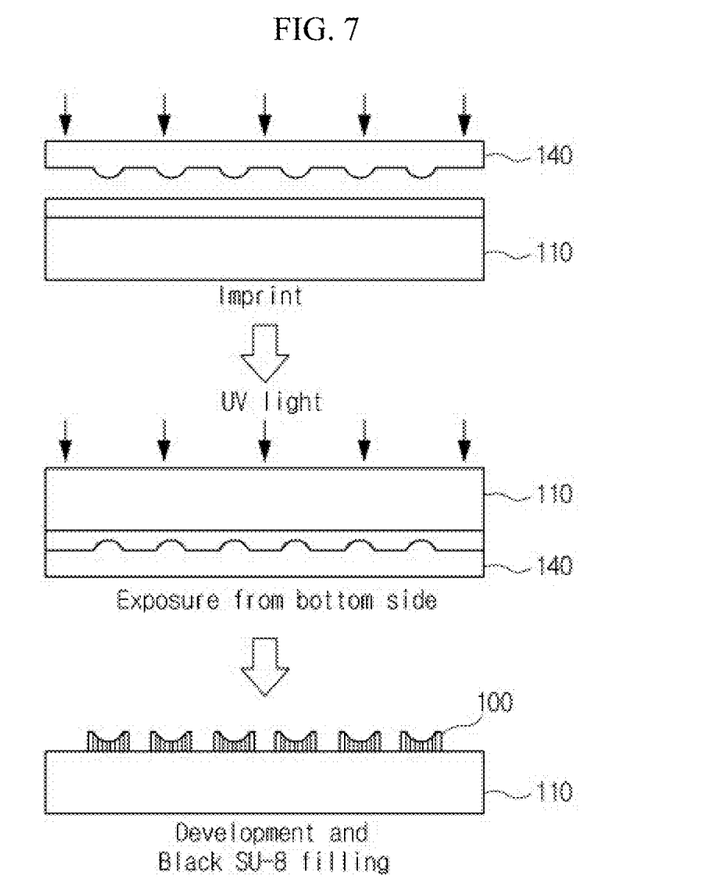
FIG. 7 is a view illustrating a wafer level process using the prism forming part of FIG. 5.
Figure 8:
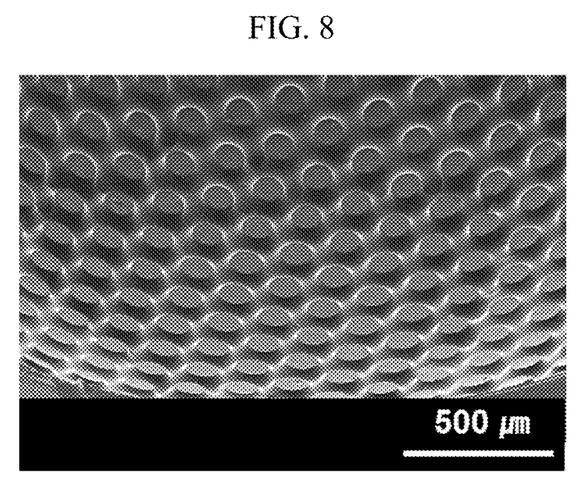
FIG. 8 is an image obtained by photographing a prism array of the ultrathin digital camera inspired by an eye of an insect according to an exemplary embodiment of the present invention by a scanning electron microscope (SEM).

FIG. 7 is a view illustrating a wafer level process using the prism forming part 150 of FIG. 5, and the prism array 100 may be formed through the wafer level process described above.

Figure 6A:
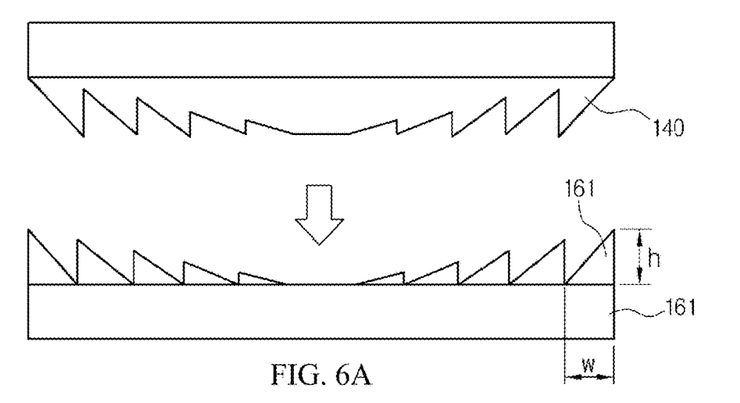
Figure 6B:
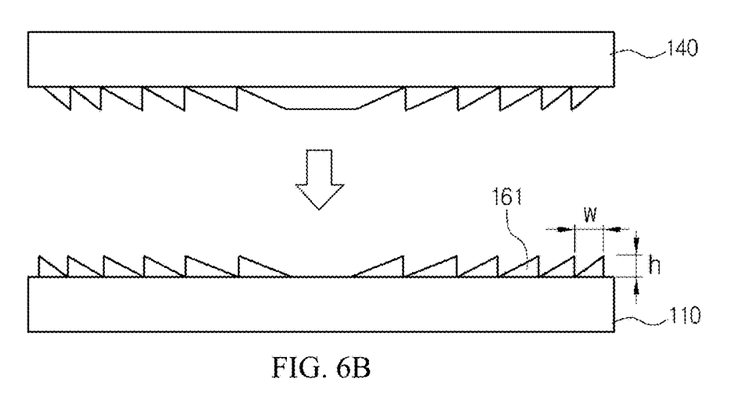

As another example, the prism forming part 140 may have a form in which sawteeth having a width or a height that gradually becomes larger from the center of the prism forming part 140 toward an edge thereof are formed on an upper surface thereof, as illustrated in FIGS. 6A and 6B. Here, regions denoted by triangles in FIGS. 6A and 6B serve as micro prisms.

The prism forming part 140 of FIG. 6A adjusts an angle at which light is refracted by changing a thickness H of the micro prism without changing a width W of the micro prism, and the prism forming part 140 of FIG. 6B adjusts an angle at which light is refracted by changing a width W of the micro prism without changing a thickness H of the micro prism.

When the ball lens is used, there is a disadvantage that a thickness of the prism array becomes thicker toward an edge of the prism array, but there is an advantage that an unnecessary thickness of the prism array is removed when using a mold in which saw teeth having a width or a height that gradually becomes larger from a center toward an edge are formed on the upper surface of the substrate.

In this case, a thickness difference between micro prisms at the center and the edge is not large, such that the step (S200) of patterning the pillar structures at predetermined intervals on one surface of the first substrate 110 may be omitted.

Figure 4E:
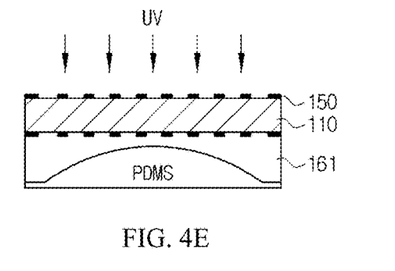

Next, in the PDMS coating step (S600), the prism forming part 140 is detached, and PDMS is coated on the colorless photoresists so that a shape is not changed in a post exposure baking (PEB) process. Here, another material may also be used instead of the PDMS.

Figure 4F:
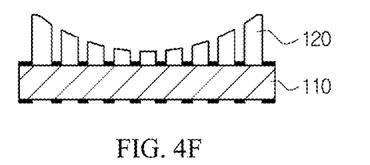

Next, in the ultraviolet (UV) ray irradiating step (S700), ultraviolet ray is irradiated on the bottom surface of the first substrate; Next, in the post exposure baking (PEB) step (S800), exposed photoresist is baked; Next, in the PDMS removing step (S900), the PDMS is removed.

Figure 4G:
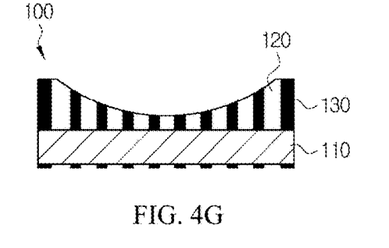

Finally, the black photoresists are filled in spaces between the transmission channels 120 having an array form in order to block light passing between the respective transmission channels 120.

In the method of manufacturing an ultrathin digital camera inspired by an eye of an insect according to an exemplary embodiment of the present invention, the prism array 100 manufactured through the processes as described above is coupled to an upper side of the micro lens array 200 that has been manufactured in advance, thereby completing the ultrathin digital camera 1 inspired by an eye of an insect.

A method of manufacturing the micro lens array 200 will be described. The micro lens array 200 may be manufactured through a spacer forming step (A100) of patterning a polymer spacer 230 on a substrate 240, a photoresist patterning step (A200) of patterning cylinder structures at predetermined intervals on the substrate 240, a reflow step (A300) of allowing the patterned cylinder structures to reflow by applying heat, a pattern duplicating step (A400) of duplicating patterns to PDMS by coating the PDMS on the substrate 240, and a micro lens array forming step (A500) of transferring the patterns to a second substrate 210 on which a UV-curable resin is coated, using the PDMS to which the patterns are duplicated.

In summary, the polymer spacer is formed, and the patterned photoresist reflow. This structure is again duplicated to the PDMS, and the patterns are finally transferred to the UV-curable resin, thereby manufacturing the micro lens array 200.

Figure 9A:
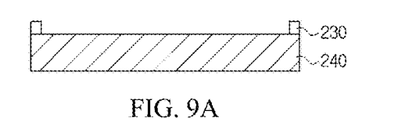
FIGS. 9A, 9B, 9C, 9D, 9E, 9F and 9G are views sequentially illustrating manufacturing steps of a micro lens array in the method of manufacturing an ultrathin digital camera inspired by an eye of an insect according to an exemplary embodiment of the present invention and views illustrating a form in which the micro lens array is coupled to the micro prism array.
Figure 9B:
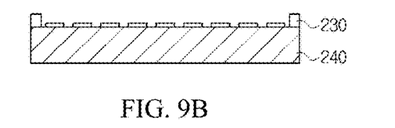
Figure 9C:
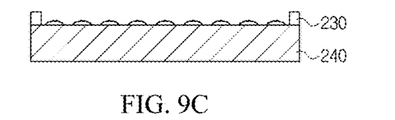
Figure 9D:
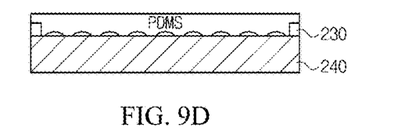
Figure 9E:
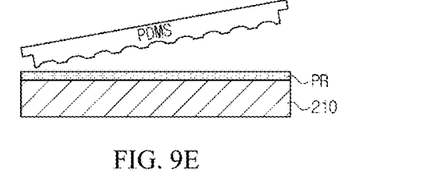
Figure 9F:
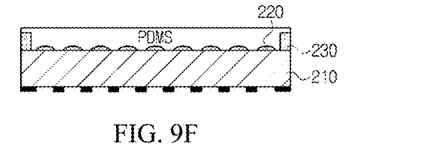

Here, the second substrate 210 may be a glass substrate through which light may pass, and an aperture array may be further formed at a lower side of the second substrate 210, as illustrated in FIG. 9F.

Figure 9G:
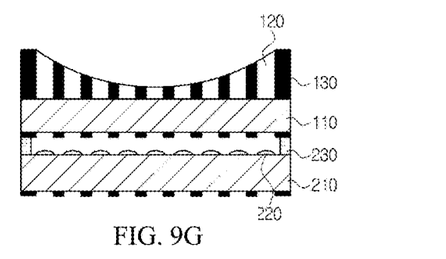

As another example, in the method of manufacturing the micro lens array 200, lenses manufactured through the reflow on a wafer in a wafer level process may also be used as they are without performing the pattern duplicating step (A400) of duplicating the patterns to the PDMS, after the reflow step (A300).

In addition, another material may also be used instead of the UV-curable resin and the PDMS used at the time of manufacturing the micro lens array 200.

Therefore, the ultrathin digital camera 1 inspired by an eye of an insect and the method of manufacturing the same according to an exemplary embodiment of the present invention are implemented so that the respective transmission channels 120 configuring the prism array 100 receive the visual information on the partial regions of the entire FOV like the visual organ of the eye of the insect, such that the ultrathin digital camera 1 has a wide FOV, may monitor rapid movement, and may be miniaturized.

In addition, since the light is refracted even at the edge of the prism array 100 to thereby be vertically incident thereto, the ultrathin digital camera 1 inspired by an eye of an insect according to an exemplary embodiment of the present invention has hardly an optical aberration, and may minimize signal distortion.

In other words, an attempt to develop a multi-aperture imaging system formed on a plane substrate while using a commercialized image sensor has been conducted in the related art. However, in this case, when the light is incident to an edge, optical axes are titled to the image plane, such that an aberration is generated. Therefore, distortion of an image is generated, or focusing is not made. On the other hand, in the present invention, since the light incident to the edge is refracted by the prism structure, several aberrations generated due to tilted optical axes may be minimized.

In addition, since a wafer level process is possible, the ultrathin digital camera inspired by an eye of an insect according to an exemplary embodiment of the present invention may be manufactured at a decreased cost, and the ultrathin digital camera inspired by an eye of an insect according to an exemplary embodiment of the present invention may be coupled to a commercialized image sensor, such that it may be applied to several fields.

The present invention is not limited to the above-mentioned exemplary embodiments but may be variously applied, and may be variously modified by those skilled in the art to which the present invention pertains without departing from the gist of the present invention claimed in the claims.

What is claimed is:

1. An ultrathin digital camera inspired by an eye of an insect, comprising:
   a prism array having a prism structure formed on a first substrate to refract light incident thereto;
   a micro lens array coupled to a lower side of the prism array in a state in which it is spaced apart from the prism array by a predetermined distance and collecting light passing through the prism array and vertically incident thereto;
   an image sensor receiving light passing through the micro lens array and processing the received light;
   wherein the prism array comprises transmission channels of a colorless photoresist formed on the first substrate and blocking regions formed of a black photoresist to absorb the light formed alternately with the transmission channels; and
   wherein an upper surface of the prism array on which the transmission channels and the blocking regions are formed has a height that becomes higher from a center thereof toward an edge thereof to refract the light incident thereto from the outside, thereby allowing the light to vertically pass through the transmission channels.

2. The ultrathin digital camera inspired by an eye of an insect of claim 1, wherein a difference between an angle at which the light is refracted in a first transmission channel and a second transmission channel is smaller than a field of view (FOV) of one transmission channel.

3. The ultrathin digital camera inspired by an eye of an insect of claim 1, wherein micro lenses of the micro lens array are positioned below the transmission channels of the prism array.

4. The ultrathin digital camera inspired by an eye of an insect of claim 3, wherein a micro lens has a diameter larger than or equal to that of a transmission channel.

5. The ultrathin digital camera inspired by an eye of an insect of claim 1, wherein a spacer is formed at an edge of the micro lens array, the spacer having a height higher than that of the micro lens array.

6. The ultrathin digital camera inspired by an eye of an insect of claim 1, wherein the first substrate is a glass substrate through which the light passes.

7. The ultrathin digital camera inspired by an eye of an insect of claim 1, wherein the micro lens array is formed on a second substrate.

8. The ultrathin digital camera inspired by an eye of an insect of claim 1, wherein apertures are formed at a lower side of the first substrate and/or a second substrate.

9. The ultrathin digital camera inspired by an eye of an insect of claim 7, wherein an aperture is formed of a metal or a black polymer.

10. The ultrathin digital camera inspired by an eye of an insect of claim 1, wherein the prism array has an anti-reflective layer or an anti-reflective nano structure having a size and a period of an optical wavelength or less on an upper surface thereof.

11. A method of manufacturing the ultrathin digital camera inspired by an eye of an insect of claim 1, comprising:
   a mask patterning step of patterning masks on one surface or both surfaces of the first substrate;
   a step of patterning pillar structures at predetermined intervals on one surface of the first substrate;
   a coating step of coating colorless photoresists on one surface of the first substrate;
   a soft baking step of removing solvent of photoresist;
   a pressing step of contacting and pressing a prism forming part having a hemispherical or spherical shape on an upper surface of the first substrate during a soft baking process;
   a polydimethylsiloxane (PDMS) coating step of coating PDMS after detaching the prism forming part;
   an ultraviolet (UV) ray irradiating step of irradiating an ultraviolet ray on the other side surface of the first substrate;
   a PDMS removing step of removing the PDMS;
   a developing step of forming the transmission channels of the prism array through a developing process; and
   a step of filling black photoresist in spaces between the transmission channels having an array form.

12. The method of manufacturing the ultrathin digital camera inspired by an eye of an insect of claim 11, further comprising apertures on the other surface of the first substrate.

13. The method of manufacturing the ultrathin digital camera inspired by an eye of an insect of claim 11, wherein the micro lens array is manufactured through:
   a spacer forming step of patterning a polymer spacer on a substrate;
   a photoresist patterning step of patterning cylinder structures at predetermined intervals on the substrate;
   a reflow step of allowing the patterned cylinder structures to reflow by applying heat;
   a pattern duplicating step of duplicating patterns to PDMS by coating the PDMS on the substrate; and
   a micro lens array forming step of transferring the patterns to a second substrate on which a UV-curable resin is coated, using the PDMS to which the patterns are duplicated.

14. The method of manufacturing the ultrathin digital camera inspired by an eye of an insect of claim 13, wherein in a process of manufacturing the micro lens array, a step of forming apertures on a surface of the substrate opposite to a surface of the substrate having the polymer spacer is further performed before the spacer forming step.

15. The method of manufacturing the ultrathin digital camera inspired by an eye of an insect of claim 11, wherein the micro lens array is manufactured, in a wafer level process, through:
   a spacer forming step of patterning polymer spacers on a substrate;
   a photoresist patterning step of patterning cylinder structures at predetermined intervals on the substrate; and
   a reflow step of allowing the patterned cylinder structures to reflow by applying heat.

16. The method of manufacturing the ultrathin digital camera inspired by an eye of an insect of claim 11, wherein the prism forming part is any one of a ball lens, a mold having a curved structure on a substrate, and a mold in which sawteeth having a width or a height that gradually becomes larger from a center toward an edge are formed on the upper surface of the substrate.

17. The method of manufacturing the ultrathin digital camera inspired by an eye of an insect of claim 16, wherein in the case in which the mold including the sawteeth having the width or the height that gradually becomes larger from the center toward the edge is the prism forming part, the step of patterning the pillar structures at the predetermined intervals on one surface of the first substrate is omitted.

18. The method of manufacturing the ultrathin digital camera inspired by an eye of an insect of claim 11, wherein the second substrate is a glass substrate through which the light passes.

19. The method of manufacturing the ultrathin digital camera inspired by an eye of an insect of claim 11, a post exposure baking (PEB) step of baking exposed photoresist is further performed as a kind of photoresist before a PDMS removing step.

* * * * *